US012811365B2

(12) United States Patent
Sugiyama et al.

(10) Patent No.: US 12,811,365 B2
(45) Date of Patent: Nov. 24, 2026

(54) EXTERNAL RESONANCE TYPE LASER MODULE

(71) Applicant: HAMAMATSU PHOTONICS K.K., Hamamatsu (JP)

(72) Inventors: Atsushi Sugiyama, Hamamatsu (JP); Tatsuo Dougakiuchi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 941 days.

(21) Appl. No.: 18/023,773

(22) PCT Filed: Jun. 7, 2021

(86) PCT No.: PCT/JP2021/021611
§ 371 (c)(1),
(2) Date: Feb. 28, 2023

(87) PCT Pub. No.: WO2022/059268
PCT Pub. Date: Mar. 24, 2022

(65) Prior Publication Data

US 2023/0246418 A1 Aug. 3, 2023

(30) Foreign Application Priority Data

Sep. 15, 2020 (JP) ................................ 2020-154508

(51) Int. Cl.
*H01S 5/14* (2006.01)
*H01S 5/024* (2006.01)
*H01S 5/34* (2006.01)

(52) U.S. Cl.
CPC .......... *H01S 5/143* (2013.01); *H01S 5/02415* (2013.01); *H01S 5/3401* (2013.01)

(58) Field of Classification Search
CPC ..... H01S 5/02415; H01S 5/023-02325; H01S 5/14-148; H01S 5/042-0428
See application file for complete search history.

(56) References Cited

U.S. PATENT DOCUMENTS 4,752,109 A * 6/1988 Gordon ................ G02B 6/4248 385/94
4,965,710 A * 10/1990 Pelly ..................... H10W 90/00 257/713
(Continued)

FOREIGN PATENT DOCUMENTS

EP 3217490 A1 * 9/2017 ......... H01S 5/02438
JP H05150146 A * 6/1993
(Continued)

OTHER PUBLICATIONS

JPH05150146A_Description_Translation (Year: 1993).*
International Preliminary Report on Patentability mailed Mar. 30, 2023 for PCT/JP2021/021611.

*Primary Examiner* — Tod T Van Roy
*Assistant Examiner* — Hunter Jared Nelson
(74) *Attorney, Agent, or Firm* — Faegre Drinker Biddle & Reath LLP

(57) ABSTRACT

The external cavity laser module includes a quantum cascade laser element, a MEMS diffraction grating, a support plate having a first surface on which the quantum cascade laser element and the MEMS diffraction grating are disposed and a second surface opposite to the first surface, and a cooling element disposed on a side facing the second surface of the support plate to overlap with the quantum cascade laser element and the MEMS diffraction grating. In the second surface of the support plate, a concave portion recessed in a direction from the second surface toward the first surface is provided in at least a region overlapping with the quantum cascade laser element and the MEMS diffraction grating when viewed from the thickness direction. At least a portion of the cooling element facing the support plate is inserted into the concave portion.

17 Claims, 3 Drawing Sheets

(56) References Cited

U.S. PATENT DOCUMENTS

| | | | | | |
|---|---|---|---|---|---|
| 5,963,697 | A * | 10/1999 | Kosugi | G02B 6/4204 | 385/88 |
| 6,088,501 | A * | 7/2000 | Delrosso | G02B 6/02176 | 385/94 |
| 6,729,143 | B1 * | 5/2004 | Watts | H10N 10/00 | 62/3.2 |
| 2003/0063442 | A1 * | 4/2003 | Kimoto | H02M 7/003 | 257/E23.079 |
| 2005/0220162 | A1 | 10/2005 | Nakamura | | |
| 2009/0213882 | A1 | 8/2009 | Weida et al. | | |
| 2009/0316743 | A1 * | 12/2009 | Alfrey | H01S 5/042 | 372/38.04 |
| 2015/0181767 | A1 * | 6/2015 | Binder | H01S 5/4025 | 361/709 |
| 2019/0052058 | A1 * | 2/2019 | Edamura | H01S 5/0622 | |

FOREIGN PATENT DOCUMENTS

| | | | |
|---|---|---|---|
| JP | H09-102650 | A | 4/1997 |
| JP | H11-307873 | A | 11/1999 |
| JP | 2001-028140 | A | 1/2001 |
| JP | 2019-036577 | A | 3/2019 |

* cited by examiner

EXTERNAL RESONANCE TYPE LASER MODULE

TECHNICAL FIELD

The present disclosure relates to an external cavity laser module.

BACKGROUND ART

As a light source for performing wavelength-sweeping (scanning), an external cavity laser module is known (see, for example, Patent Document 1). The external cavity laser module includes a quantum cascade laser element (hereinafter referred to as "QCL element") and a diffraction grating that diffracts and reflects light emitted from the QCL element. Patent Document 1 discloses a configuration in which the QCL element and the diffraction grating are disposed on a main surface of a support plate, and a Peltier element serving as a cooling element is disposed on a back surface of the support plate.

CITATION LIST

Patent Document

Patent Document 1: Japanese Unexamined Patent Application Publication No. 2019-036577

SUMMARY OF INVENTION

Technical Problem

Since the QCL element generates a larger amount of heat than other laser light sources such as a laser diode, the external cavity laser module including the QCL element is required to have high cooling performance. In the configuration disclosed in Patent Document 1, the module is cooled by the Peltier element disposed on the opposite side of the QCL element and the diffraction grating with the support plate interposed therebetween. Here, in order to obtain higher cooling performance, it is conceivable to make the support plate as thin as possible. However, the present inventors have found that the above-described measures have the following problems. That is, if the support plate is simply thinned, the physical stability of the support plate is impaired, and the positional relationship between the QCL element and the diffraction grating may deviate. As a result, the optical characteristics of the external cavity laser module may deteriorate.

Accordingly, it is an object of one aspect of the present disclosure to provide an external cavity laser module capable of improving a cooling effect while suppressing deterioration of optical characteristics.

Solution to Problem

An external cavity laser module according to an aspect of the present disclosure includes: a quantum cascade laser element; a diffraction grating configured to diffract and reflect a portion of light emitted from the quantum cascade laser element and return the diffracted and reflected light to the quantum cascade laser element; a support plate having a first surface on which the quantum cascade laser element and the diffraction grating are disposed and a second surface opposite to the first surface; and a cooling element disposed on a side facing the second surface of the support plate so as to overlap with the quantum cascade laser element and the diffraction grating when viewed from a thickness direction of the support plate. A concave portion that is recessed in a direction from the second surface toward the first surface is provided in at least a region of the second surface of the support plate that overlaps with the quantum cascade laser element and the diffraction grating when viewed from the thickness direction of the support plate. At least a portion of the cooling element facing the support plate is inserted into the concave portion.

In the external cavity laser module, a concave portion is provided in a region overlapping with the quantum cascade laser element and the diffraction grating on a second surface of the support plate (a surface opposite to a first surface on which the quantum cascade laser element and the diffraction grating are disposed). In addition, a cooling element is inserted into the concave portion. With such a configuration, it is possible to shorten the interval between the quantum cascade laser element and the cooling element compared to a case where the concave portion is not provided in the support plate. Thus, the cooling effect by the cooling element can be enhanced. In addition, the portion of the support plate where the concave portion is not provided can be thick enough to maintain the strength of the support plate. As a result, the physical stability of the support plate can be improved as compared with a case where the support plate is uniformly thinned. As a result, deterioration of the optical characteristics of the external cavity laser module can be suppressed.

When viewed from the thickness direction of the support plate, at least a portion of an inner surface of the concave portion may be in contact with at least a portion of an outer edge of the cooling element. In this case, since the cooling element can be positioned by the concave portion, it is possible to prevent variations in the arrangement of the cooling element among products. Thus, the cooling effect by the cooling element can be stabilized.

The diffraction grating may include a diffraction reflection portion configured to diffract and reflect a portion of the light emitted from the quantum cascade laser element, and may return the portion of the light to the quantum cascade laser element by oscillating the diffraction reflection portion. In this case, in the Littrow type external cavity laser module in which the diffraction grating is provided integrally with the movable mechanism, it is possible to enhance the cooling effect while suppressing deterioration of the optical characteristics.

A circuit board for controlling operation of the quantum cascade laser element may not be disposed on a side of the cooling element opposite to a side of the cooling element facing the support plate. In this case, since the circuit board as the heat generation source is not provided on the side opposite to the support plate in the cooling element, it is possible to prevent the exhaust heat of the cooling element from being hindered. Thus, the cooling effect by the cooling element can be further enhanced.

An auxiliary cooling element that further cools the cooling element may be disposed on the side of the cooling element opposite to the side of the cooling element facing the support plate. In this case, the cooling effect can be further enhanced by the auxiliary cooling element.

The external cavity laser module may further include: a plurality of struts erected on the first surface of the support plate and extending along the thickness direction of the support plate; and a strut connecting member disposed at a position farther from the support plate than the quantum cascade laser element in the thickness direction of the support plate and connected to an end portion of each of the plurality of struts. According to the above configuration, since the support plate is appropriately supported by the plurality of struts and the strut connecting member, the physical stability of the support plate can be further improved. As a result, it is possible to more effectively suppress the deterioration of the optical characteristics of the external cavity laser module.

The external cavity laser module may further include: a plurality of first struts erected on the first surface of the support plate and extending along the thickness direction of the support plate; and a first circuit board disposed at a position farther from the support plate than the quantum cascade laser element in the thickness direction of the support plate and connected to an end portion of each of the plurality of first struts. The first circuit board may be a circuit board for controlling an operation of the quantum cascade laser element. If the first circuit board is in contact with the cooling element, heat generated from the first circuit board may be transferred to the quantum cascade laser element through the cooling element and the support plate. Alternatively, heat generated from the first circuit board may inhibit exhaust heat from the cooling element. On the other hand, according to the configuration in which the first circuit board is supported via the plurality of first struts as described above, it is possible to avoid the above-described problem by disposing the first circuit board, which is a heat generation source, at a position away from the cooling element. Further, as described above, it is possible to obtain an effect of improving the physical stability of the support plate. That is, the first circuit board can function as the strut connecting member described above.

The external cavity laser module may further include a noise filter circuit that receives a power signal from an external power source, removes noise included in the power signal, and outputs the power signal from which the noise has been removed to the first circuit board. According to the above configuration, since the noise superimposed on the power signal is removed by the noise filter circuit, it is possible to prevent damage to the first circuit board caused by an electrostatic surge or the like.

The external cavity laser module may further include: a plurality of second struts erected on the first surface of the support plate and extending along the thickness direction of the support plate; and a second circuit board disposed at a position between the quantum cascade laser element and the first circuit board in the thickness direction of the support plate and connected to an end portion of each of the plurality of second struts. The first circuit board may have a higher heat generation property than the second circuit board. According to the above configuration, since heat generated from the first circuit board is shielded by the second circuit board, heat transfer from the first circuit board to the quantum cascade laser element can be suppressed.

The second circuit board may overlap with at least a portion of the quantum cascade laser element and at least a portion of the first circuit board when viewed from the thickness direction of the support plate. According to the above configuration, it is possible to more effectively suppress heat transfer from the first circuit board to the quantum cascade laser element.

The second circuit board may be a circuit board that includes a noise filter circuit. The noise filter circuit may be configured to receive a power signal from an external power source, remove noise included in the power signal, and output the power signal from which the noise has been removed to the first circuit board. According to the above configuration, it is possible to make the substrate on which the noise filter circuit is mounted function as the second circuit board that shields heat generated from the first circuit board, thereby making it possible to reduce the size of the device.

The external cavity laser module may further include a heat transfer sheet disposed between the support plate and the cooling element in the concave portion of the support plate. According to the above configuration, the heat transfer performance between the support plate and the cooling element can be improved, so that the cooling effect can be further enhanced.

The external cavity laser module may further include a base plate disposed on a side of the cooling element opposite to a side of the cooling element facing the support plate. A concave portion into which at least a portion of the cooling element on a side facing the base plate is inserted may be provided on a surface of the base plate facing the cooling element. According to the above configuration, the cooling element can be easily arranged with respect to the base plate by the concave portion provided in the base plate.

Advantageous Effects of Invention

According to an aspect of the present disclosure, it is possible to provide an external cavity laser module capable of improving a cooling effect while suppressing deterioration of optical characteristics.

DESCRIPTION OF EMBODIMENTS

Figure 1:
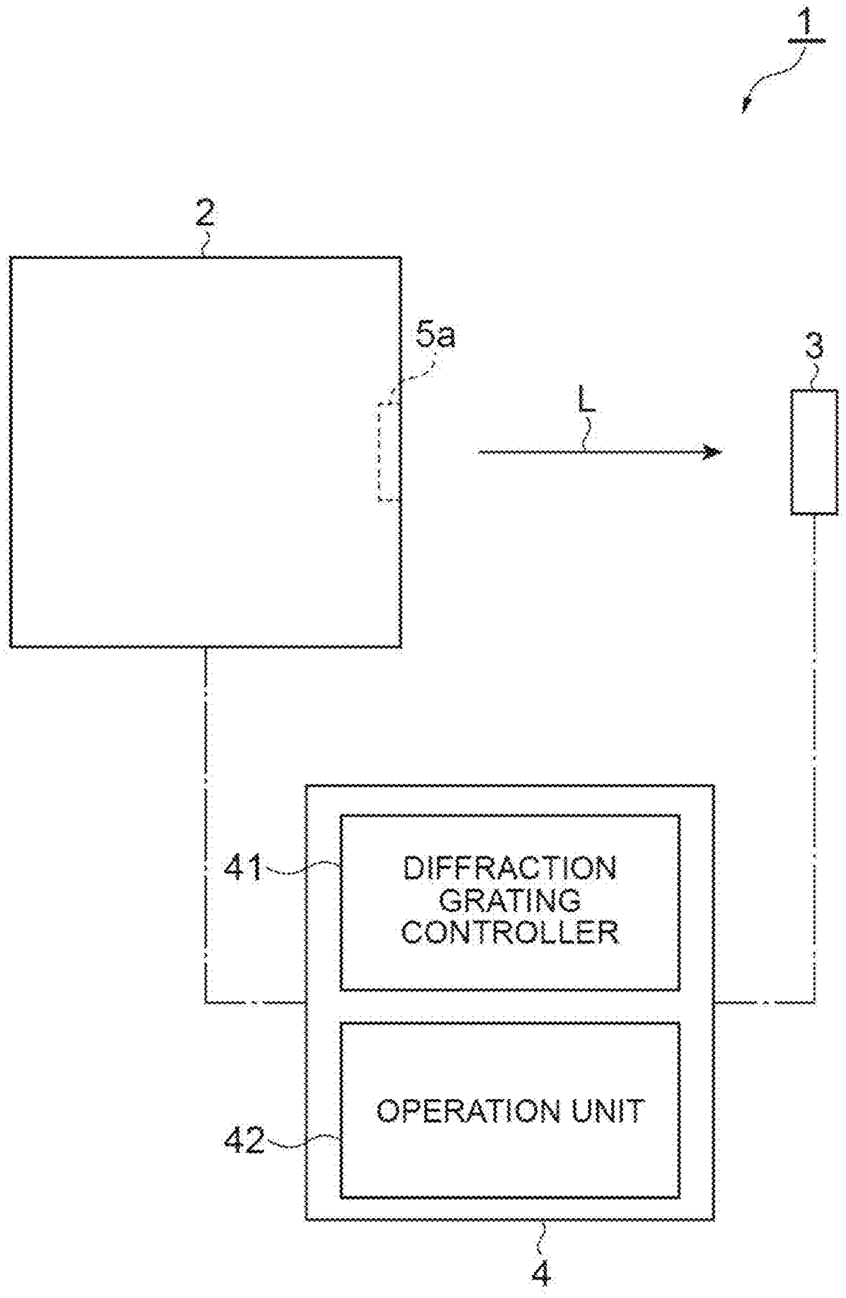
FIG. 1 is a configuration diagram of an analyzing device including an external cavity laser module according to an embodiment.

Hereinafter, an embodiment of the present invention will be described in detail with reference to the drawings. In the following description, the same or corresponding elements are denoted by the same reference numerals, and redundant description is omitted.

[Configuration of Analyzing Device]

As shown in FIG. 1, the analyzing device 1 includes an external cavity laser module 2 (hereinafter referred to as a "laser module 2"), a photodetector 3, and a controller 4. The analyzing device 1 is a device for performing spectroscopic analysis by measuring an absorption spectrum. The analyzing device 1 is used, for example, in a state where an analysis target accommodated in a light-transmissive container is disposed between the laser module 2 and the photodetector 3. The object to be analyzed may be any of gas, liquid, and solid. Note that the analysis target may not be accommodated in the container.

The laser module 2 is a wavelength variable light source in which the wavelength of the output light L is variable. When the absorption spectrum is measured, the laser module 2 performs wavelength sweeping in a predetermined wavelength range by changing the wavelength of the output light L at high speed. The photodetector 3 detects the intensity of the output light L that has been output from the laser module 2 and transmitted through the analysis target (or light reflected or scattered by the analysis target). As the photodetector 3, for example, an MCT (mercury cadmium tellurium) detector, an InAsSb (indium arsenic antimony) photodiode, a thermopile, or the like can be used. The controller 4 calculates an absorption spectrum based on a detection result of the photodetector 3. The controller 4 is electrically connected to the laser module 2 and the photodetector 3. Details of the controller 4 will be described later.

[Configuration of External Cavity Laser Module]

Figure 2:
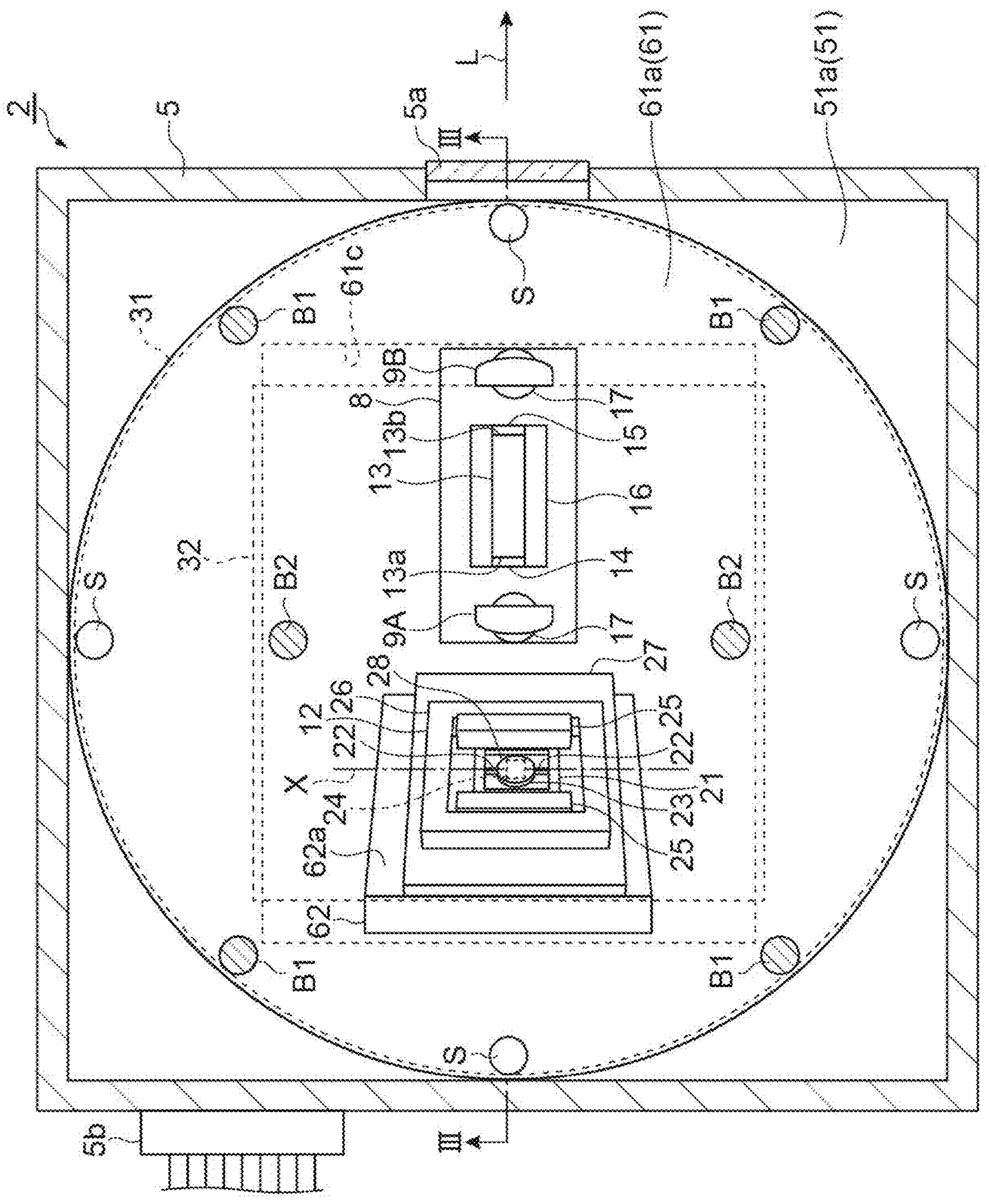
FIG. 2 is a cross-sectional view of the external cavity laser module.
Figure 3:
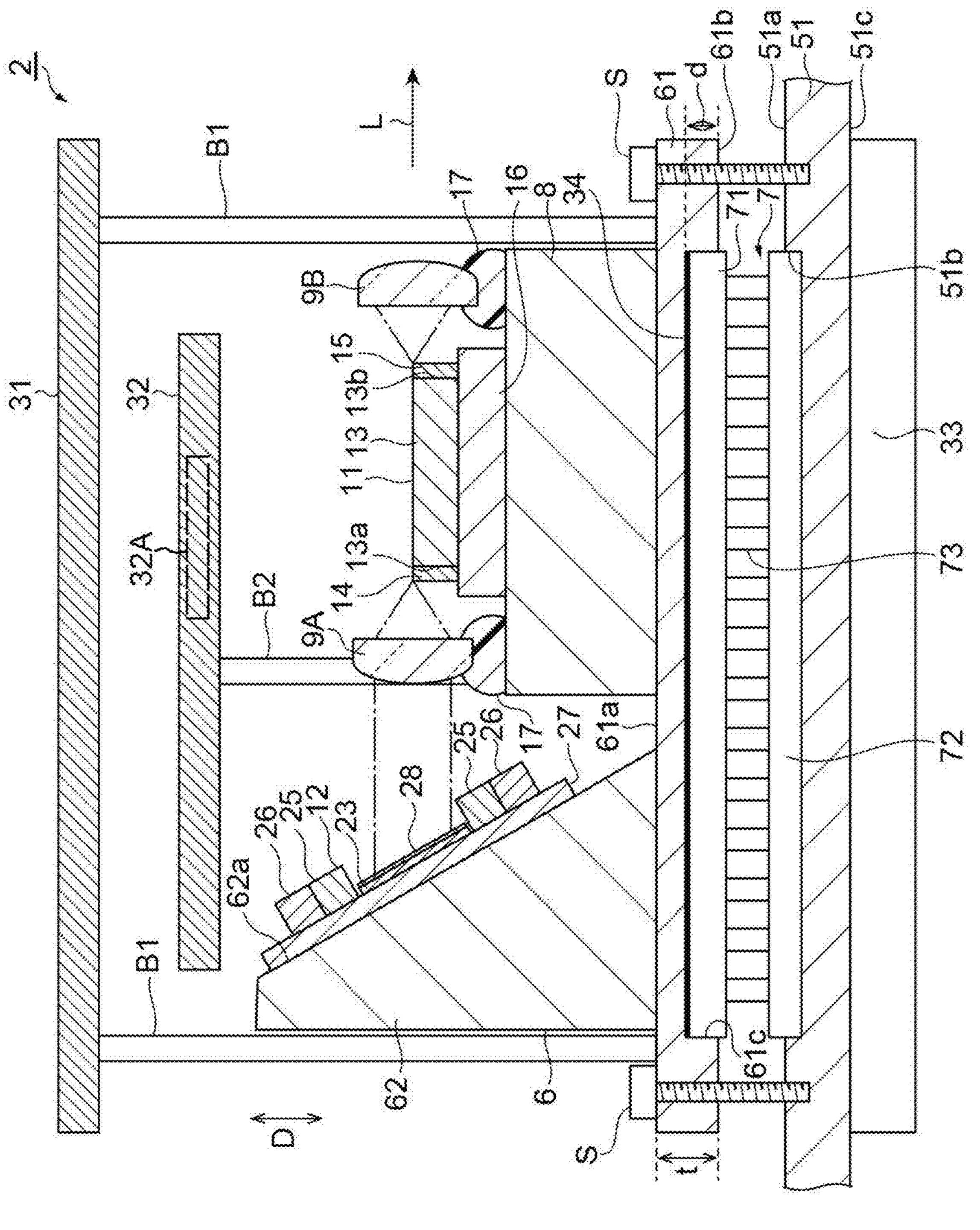
FIG. 3 is a cross-sectional view taken along line III-III of FIG. 2.

The configuration of the laser module 2 will be described with reference to FIGS. 2 and 3. In FIG. 3, the top wall and a side wall of the housing 5 are not shown. As shown in FIGS. 2 and 3, the laser module 2 includes a housing 5, a support member 6, a cooling element 7, a heat sink 8, a lens 9A, a lens 9B, a quantum cascade laser 11 (hereinafter referred to as "QCL 11"), a MEMS diffraction grating 12 (diffraction grating), a first circuit board 31, a second circuit board 32, an auxiliary cooling element 33, a plurality of (four in this embodiment) first struts B1, and a plurality of (two in this embodiment) second struts B2.

The housing 5 houses the support member 6, the cooling element 7, the heat sink 8, the lens 9A, the lens 9B, the QCL 11, the MEMS diffraction grating 12, the first circuit board 31, the second circuit board 32, the plurality of strut B1, and the plurality of strut B2. The housing 5 is formed in a box shape, for example, and has a window 5*a* for outputting the output light L from the laser module 2 to the outside. Further, the housing 5 is provided with a leader 5*b* for leading out wiring or the like to the outside. As an example, a length of each side of the housing 5 is about 70 mm. The housing 5 has a bottom wall 51 (base plate) for fixing the support member 6 via a screw.

The support member 6 is formed of, for example, a metallic material having good thermal conductivity. The support member 6 is made of, for example, aluminum (Al). The support member 6 includes a flat support plate 61 and a wall portion 62 erected on the support plate 61. The support member 6 is fixed on the bottom wall 51 of the housing 5 via the cooling element 7.

The support plate 61 functions as an optical stage on which the QCL 11, the MEMS diffraction grating 12, and other optical elements (e.g., lens 9A, lens 9B, etc.) are disposed. The support plate 61 includes a first surface 61*a* on which the QCL 11 and the MEMS diffraction grating 12 are disposed, and a second surface 61*b* opposite to the first surface 61*a*. As an example, the support plate 61 is formed in a circular shape in plan view (when viewed from a thickness direction D of the support plate 61). That is, the support plate 61 is a disk-shaped member. The support plate 61 is screwed to the bottom wall 51 by four screws S arranged at intervals of 90° along the outer edge of the support plate 61.

In the second surface 61*b* of the support plate 61, in at least a region overlapping with the quantum cascade laser element 13 (hereinafter referred to as "QCL element 13") and the MEMS diffraction grating 12 when viewed from the thickness direction D, a concave portion 61*c* (counterbore) recessed in a direction from the second surface 61*b* toward the first surface 61*a* is provided. As an example, when viewed from the thickness direction D, the concave portion 61*c* is formed in a rectangular region including the heat sink 8 on which the QCL element 13 is mounted and the wall portion 62 on which the MEMS diffraction grating 12 is mounted. From the viewpoint of securing the strength of the support plate 61, a thickness t of the support plate 61 (i.e., the thickness of the portion where the concave portion 61*c* is not formed) is, for example, about 2 mm to 8 mm. A ratio (d/t) of a depth d of the concave portion 61*c* to the thickness t of the support plate 61 is, for example, about 10% to 50%.

The wall portion 62 has an inclined surface 62*a* inclined with respect to the support plate 61. The MEMS diffraction grating 12 is fixed on the inclined surface 62*a*. The configuration of the MEMS diffraction grating 12 will be described later.

The cooling element is a cooling device that includes, for example, a Peltier element. The cooling element 7 is sandwiched between the support plate 61 and the bottom wall 51 by screwing the support plate 61 to the bottom wall 51 as described above. The cooling element 7 includes a first substrate 71, a second substrate 72, and a heat transfer portion 73. The first substrate 71 is a flat plate-shaped member and is thermally coupled to the second surface 61*b* of the support plate 61. The second substrate 72 is a flat plate-shaped member similar to the first substrate 71, and is thermally coupled to the bottom wall 51 of the housing 5. The heat transfer portion 73 is disposed between the first substrate 71 and the second substrate 72, and transfers heat between the first substrate 71 and the second substrate 72.

The cooling element 7 is disposed on a side facing the second surface 61*b* of the support plate 61 so as to overlap with the QCL element 13 and the MEMS diffraction grating 12 when viewed from the thickness direction D. At least a portion of the cooling element 7 facing the support plate 61 (that is, at least a portion on a side of the first substrate 71 facing the support plate 61) is inserted into the concave portion 61*c*. In the present embodiment, when viewed from the thickness direction D, at least a portion of the inner surface of the concave portion 61*c* is in contact with at least a portion of the outer edge of the cooling element 7. As an example, the first substrate 71 of the cooling element 7 has a rectangular shape corresponding to the concave portion 61*c* in plan view (when viewed from the thickness direction D). Thus, at least a portion of the cooling element 7 on a side facing the support plate 61 is fitted into the concave portion 61*c*. In the concave portion 61*c*, a heat transfer sheet 34 is disposed between the support plate 61 and the cooling element 7 (first substrate 71). The heat transfer sheet 34 is, for example, a graphite sheet. A thickness of the heat transfer sheet 34 is, for example, about several μm to several tens of μm. Note that the dimension of the cooling element 7 (in the present embodiment, the first substrate 71) does not necessarily match (correspond to) the dimension of the concave portion 61*c*. That is, the cooling element 7 (first substrate 71) may be formed to have a size that can be inserted into the concave portion 61*c*. For example, the cooling element 7 (the first substrate 71) may be slightly smaller than the concave portion 61*c*. However, when the dimension of the cooling element 7 (first substrate 71) is made to match the dimension of the concave portion 61*c*, the cooling element 7 can be easily positioned in the concave portion 61*c*.

A concave portion 51*b* is provided on a surface 51*a* of the bottom wall 51 of the housing 5 on a side facing the cooling element 7. At least a portion of the cooling element 7 on a side facing the bottom wall 51 (that is, at least a portion of the second substrate 72 on a side facing the bottom wall 51) is inserted into the concave portion 51*b*. In the present embodiment, the concave portion 51*b* has a rectangular shape corresponding to the second substrate 72 in plan view (when viewed from the thickness direction D). Thus, at least a portion of the cooling element 7 on a side facing the bottom wall 51 is fitted into the concave portion 51*b*. In the concave portion 51*b*, a heat transfer sheet similar to the heat transfer sheet 34 may be disposed between the bottom wall 51 and the cooling element 7 (second substrate 72). Further, the dimension of the cooling element 7 (in the present embodiment, the second substrate 72) does not necessarily match (correspond to) the dimension of the concave portion 51*b*. That is, the cooling element 7 (second substrate 72) may be formed to have a size that can be inserted into the concave portion 51*b*. For example, the cooling element 7 (the second substrate 72) may be slightly smaller than the concave portion 51*b*. However, when the dimension of the cooling element 7 (second substrate 72) is matched with the dimension of the concave portion 51*b*, the cooling element 7 can be easily positioned in the concave portion 51*b*.

In the present embodiment, the circuit board for controlling the operation of the QCL element 13 is not disposed on a side (that is, the side on which the bottom wall 51 is disposed with respect to the cooling element 7) of the cooling element 7 opposite to a side of the cooling element 7 facing the support plate 61. More specifically, the circuit board is provided neither inside the bottom wall 51 nor outside the bottom wall 51. According to the above configuration, space for an additional cooling element for further cooling the cooling element 7 is secured. An auxiliary cooling element 33 that further cools the cooling element 7 is disposed on a side of the cooling element 7 (in the present embodiment, the outer surface 51*c* of the bottom wall 51) opposite to a side of the cooling element 7 facing the support plate 61. The auxiliary cooling element 33 is, for example, cooling devices such as a water-cooled chiller and an air-cooled fan. The auxiliary cooling element 33 is thermally coupled to the outer surface 51*c* of the bottom wall 51. Thus, heat can be released from the cooling element 7 to the auxiliary cooling element 33 through the bottom wall 51.

The QCL 11 has a QCL element 13. The QCL element 13 has a first end surface 13*a* and a second end surface 13*b* opposite to each other. The QCL element 13 emits broadband light in a mid-infrared region (for example, 4 μm or more and 16 μm or less) from each of the first end surface 13*a* and the second end surface 13*b*. The QCL element 13 has a structure in which a plurality of active layers having center wavelengths different from each other are stacked, and can emit light in a wide band as described above. The QCL element 13 may have a structure composed of a single active layer, and even in this case, the QCL element 13 can emit broadband light as described above.

The first end surface 13*a* of the QCL element 13 is provided with a reflection reducing portion 14. The reflection reducing portion 14 is constituted by an AR (Anti Reflection) layer having a reflectance of less than 0.5%, for example. The reflection reducing portion 14 reduces the reflectivity when light is emitted from the first end surface 13*a* of the QCL element 13 to the outside and reduces the reflectivity when light is incident on the first end surface 13*a* of the QCL element 13 from the outside.

A second end surface 13*b* of the QCL element 13 is provided with a reflection reducing portion 15. The reflection reducing portion 15 is constituted by an AR layer having a reflectance in a range of 0.6% to 10%, for example. The reflection reducing portion 15 reduces reflectivity when light is emitted from the second end surface 13*b* of the QCL element 13 to the outside. The reflection reducing portion 15 reflects a portion of the light emitted from the second end surface 13*b* of the QCL element 13 and transmits the remaining portion of the light. The light transmitted through the reflection reducing portion 15 becomes output light L of the QCL 11. The second end surface 13*b* may not be provided with the reflection reducing portion 15. That is, the second end surface 13*b* may be exposed.

The QCL 11 is fixed on the support member 6 via the submount 16 and the heat sink 8. More specifically, the heat sink 8 is fixed on the first surface 61*a* of the support plate 61, and the submount 16 is fixed on the heat sink 8. The QCL 11 is fixed on the submount 16. The submount 16 is a ceramic substrate containing, for example, aluminum nitride (AlN). The heat sink 8 is a heat dissipation member made of, for example, copper (Cu). As an example, the QCL 11 is die-bonded to the submount 16. The submount 16 is die-bonded to the heat sink 8. The heat sink 8 is screw-fixed to the support plate 61. The heat sink 8 may be provided with an electrode pad (for example, a ceramic electrode pad) (not shown) for supplying a pulse drive current to the QCL element 13. The electrode pad is connected to an anode terminal and a cathode terminal of the QCL element 13.

The lenses 9A and 9B are aspherical lenses made of, for example, zinc selenide (ZnSe) or germanium (Ge), and are fixed on the heat sink 8 by ultraviolet curing resin 17. Although the lenses 9A and 9B are directly attached to the ultraviolet curing resin 17 in FIG. 3, the laser module 2 may include a lens holder that accommodates the lenses 9A and 9B. In this case, the lens holders respectively accommodating the lenses 9A and 9B are fixed on the heat sink 8 via the ultraviolet curing resin 17. The lens 9A is disposed on a side facing the first end surface 13*a* of the QCL element 13, and collimates light emitted from the first end surface 13*a*. The lens 9B is disposed on a side facing the second end surface 13*b* of the QCL element 13, and collimates light emitted from the second end surface 13*b*. The light collimated by the lens 9B is output to the outside through the window 5*a* of the housing 5.

The light collimated by the lens 9A enters the MEMS diffraction grating 12. The MEMS diffraction grating 12 diffracts and reflects the incident light, thereby returning light of specific wavelengths of the incident light to the first end surface 13*a* of the QCL element 13. That is, the MEMS diffraction grating 12 and the reflection reducing portion 15 constitute a Littrow type external resonator. Accordingly, the laser module 2 may amplify light having a specific wavelength and output the amplified light to the outside.

Further, in the MEMS diffraction grating 12, as described later, the direction of the diffraction reflection portion 28 that diffracts and reflects incident light can be changed at high speed. As a result, the wavelengths of the returning light from the MEMS diffraction grating 12 to the first end surface 13*a* of the QCL element 13 are variable, and thus the wavelengths of the output light L of the laser module 2 are variable.

The MEMS diffraction grating 12 includes a support unit 21, a pair of connection portions 22, 22, a movable portion 23, a coil 24, a pair of magnets 25, 25, and a yoke 26. The MEMS diffraction grating 12 is configured as a MEMS device that oscillates the movable portion 23 around the axis line X. The MEMS diffraction grating 12 is fixed on the inclined surface 62*a* of the wall portion 62 of the support member 6 through a mounting member 27. The mounting member 27 is a flat plate-shaped member having a substantially rectangular shape in plan view (when viewed from a direction perpendicular to a plane on which at least the support unit 21 and the movable portion 23 are disposed).

The support unit 21 is a flat plate-shaped frame body having a rectangular shape in a plan view. The support unit 21 supports the movable portion 23 and the like via the pair of connection portions 22. Each connection portion 22 is a flat plate-like member having a rectangular shape in plan view, and extends along the axis line X. Each connection portion 22 connects the movable portion 23 to the support unit 21 on the axis line X so that the movable portion 23 can freely swing around the axis line X.

The movable portion 23 is a flat plate-shaped member having a circular shape in plan view, and is located inside the support unit 21. As described above, the movable portion 23 is swingably coupled to the support unit 21. The support unit 21, the connection portion 22, and the movable portion 23 are integrally formed, for example, by being built into one SOI substrate.

A diffraction reflection portion 28 is provided on a surface of the movable portion 23 facing the QCL 11. The diffraction reflection portion 28 has a diffraction reflection surface that diffracts and reflects the light emitted from the QCL 11. The diffraction reflection portion 28 is provided over the surface of the movable portion 23, for example, and includes a resin layer in which a diffraction grating pattern is formed, and a metal layer provided over the surface of the resin layer so as to follow the diffraction grating pattern. Alternatively, the diffraction reflection portion 28 may be provided on the movable portion 23 and may include only a metal layer on which a diffraction grating pattern is formed. The diffraction grating pattern is, for example, a blazed grating having a saw-tooth cross section, a binary grating having a rectangular cross section, or a holographic grating having a sinusoidal cross section.

The coil 24 is made of a metal material such as copper, and is embedded in a groove formed on the surface of the movable portion 23. The coil 24 is spirally wound a plurality of turns in a plan view. Wires for connection to the outside are electrically connected to an outer end portion and an inner end portion of the coil 24. The wiring is provided over the support unit 21, the connection portion 22, and the movable portion 23, for example, and is electrically connected to an electrode provided on the support unit 21.

The magnets 25, 25 generate a magnetic field that acts on the coil 24. The magnets 25, 25 are formed in a rectangular parallelepiped shape, and is disposed so as to face a pair of side portions of the support unit 21 parallel to the axis line X. The arrangement of the magnetic poles in each magnet 25 is, for example, a Halbach array. Alternatively, the magnets 25, 25 may be a pair of magnets arranged at a predetermined interval. The yoke 26 amplifies the magnetic force of the magnet 25. The yoke 26 has a rectangular frame shape in a plan view and is disposed so as to surround the support unit 21 and the magnets 25, 25.

In the MEMS diffraction grating 12, when a current flows through the coil 24, a Lorentz force is generated in a predetermined direction in electrons flowing through the coil 24 by a magnetic field generated by the magnets 25, 25. Thus, the coil 24 receives a force in a predetermined direction. Therefore, the movable portion 23 (diffraction reflection portion 28) can be swung around the axis line X by controlling the direction or magnitude of the current flowing through the coil 24. In addition, by passing a current having a frequency corresponding to the resonance frequency of the movable portion 23 through the coil 24, the movable portion 23 can be swung at a high speed at the resonance frequency level. In this way, the coil 24 and the magnet 25 function as an actuator unit that swings the movable portion 23.

The plurality (four) of struts B1 are erected on the first surface 61*a* of the support plate 61 and extend along the thickness direction D. The strut B1 is, for example, made of a metallic material such as stainless steel. As an example, when viewed from the thickness direction D, four struts B1 are disposed outside of each corner portion of the region where the concave portion 61*c* is formed. An end portion (upper end portion) of each strut B1 opposite to an end portion thereof near the support plate 61 is connected to the first circuit board 31. For example, the upper end portion of each strut B1 is screw-fixed to the first circuit board 31.

The first circuit board 31 is a circuit board for controlling the operation of the QCL element 13. As an example, a pulse driver circuit for pulse-driving the QCL element 13 is mounted on the first circuit board 31. The first circuit board 31 is electrically connected to the QCL element 13 via wiring (not shown) or the like. As an example, the first circuit board 31 is electrically connected to the QCL element 13 via wiring, an electrode pad provided on the heat sink 8, and the like. As an example, the first circuit board 31 is formed in a disc shape. In the thickness direction D, the first circuit board 31 is disposed at a position (that is, a position above the respective members described below) farther from the support plate 61 than the respective members (the QCL element 13, the MEMS diffraction grating 12, and the like) disposed on the first surface 61*a* of the support plate 61. The size of the first circuit board 31 viewed from the thickness direction D is substantially the same as that of the support plate 61. The first circuit board 31 overlaps with the support plate 61 when viewed from the thickness direction D.

The plurality (two) of struts B2 are erected on the first surface 61*a* of the support plate 61 and extend along the thickness direction D. The material of the strut B2 is, for example, a metallic material similar to the strut B1 (for example, stainless steel). As an example, the two struts B2 are disposed to face each other in a direction orthogonal to the emission direction of the output light L and the thickness direction D with each member (the QCL element 13, the MEMS diffraction grating 12, and the like) disposed on the first surface 61*a* of the support plate 61 interposed therebetween in the central portion in the housing 5. An end portion (upper end portion) of each strut B2 opposite to an end portion thereof near the support plate 61 is connected to the second circuit board 32. For example, the upper end portion of each strut B2 is screw-fixed to the second circuit board 32.

The second circuit board 32 is a circuit board on which a noise filter circuit 32A is mounted. The noise filter circuit 32A receives a power signal from an external power supply, removes noise included in the power signal, and outputs the noise-removed power signal to the first circuit board 31. The noise filter circuit 32A plays a role of protecting internal members such as the pulse driver circuit (first circuit board 31), the QCL element 13, and the MEMS diffraction grating 12 from, for example, an electrostatic surge. The second circuit board 32 is smaller than the first circuit board 31 and is formed in a rectangular plate shape. The second circuit board 32 is disposed at a position between the QCL element 13 and the first circuit board 31 in the thickness direction D. In the present embodiment, in the thickness direction D, the second circuit board 32 is disposed above the respective members (the QCL element 13, the MEMS diffraction grating 12, and the like) disposed on the first surface 61*a* of the support plate 61, and is disposed below the first circuit board 31 (on a side near the support plate 61).

When viewed from the thickness direction D, the second circuit board 32 overlaps with at least a portion of the QCL element 13 and at least a portion of the first circuit board 31. In the present embodiment, when viewed from the thickness direction D, the entire of the second circuit board 32 overlaps with a portion of the first circuit board 31, and the entire of the QCL element 13 and MEMS diffraction grating 12 overlap with the second circuit board 32.

Here, the external resonance type laser using a gain medium (that is, the QCL element 13) having a quantum cascade structure requires a higher driving voltage and a larger driving current for pulse driving than a general semiconductor laser. Therefore, the first circuit board 31 on which the pulse driver circuit is mounted has a relatively high heat generation property. On the other hand, the noise filter circuit 32A is non-pyrogenic. In other words, the first circuit board 31 on which the pulse driver circuit is mounted has higher heat generation than the second circuit board 32 on which the noise filter circuit 32A is mounted. In this manner, the second circuit board 32, which generates a smaller amount of heat than the first circuit board 31, is disposed between the first circuit board 31 and each member (the QCL element 13, the MEMS diffraction grating 12, and the like) disposed on the support plate 61. This suppresses heat generated from the pulse driver circuit from being transmitted to each member (particularly, the QCL element 13).

[Control for Analyzing Device]

The analyzing device 1 is controlled by the controller 4. As illustrated in FIG. 1, the controller 4 includes a diffraction grating controller 41 that controls driving of the MEMS diffraction grating 12, and an operation unit 42 that calculates an absorption spectrum based on a detection result of the photodetector 3. The controller 4 can be configured by, for example, a computer including an arithmetic circuit such as a CPU that performs arithmetic processing, a recording medium configured by a memory such as a RAM or a ROM, and an input/output device. The controller 4 may be configured by a computer such as a smart device including a smartphone, a tablet terminal, or the like. The controller 4 can operate by causing a computer to read a program or the like. The controller 4 may include a function generator for generating a control pulse, a driver for controlling the cooling element 7, and the like. The function generator drives the QCL 11 and the MEMS diffraction grating 12 in association with each other by a program based on outputs of two channels. In addition, the controller 4 may be configured to communicate with the first circuit board 31 and the second circuit board 32. For example, a timing signal having a driving frequency is supplied from a function generator of the controller 4 to the first circuit board 31 (pulse driver circuit). The frequencies of the pulse currents are variable within a range of 100 kHz to 500 kHz, for example. For example, a pulse current having a pulse width of 100 ns is applied from the first circuit board 31 (pulse driver circuit) to the QCL element 13, and a laser beam having an optical pulse width of 100 ns is oscillated. In addition, the controller 4 may sample the output from the photodetector 3 by an oscilloscope or via an AD converter using the drive cycle of the MEMS diffraction grating 12 as a trigger. The diffraction grating controller 41 and the operation unit 42 may not be configured by a single computer, but may be configured by separate computers or electronic circuits. For example, the diffraction grating controller 41 may be configured by an electronic circuit included in the MEMS diffraction grating 12.

[Effect]

In the laser module 2 described above, the concave portion 61*c* is provided in a region overlapping with the QCL element 13 and the MEMS diffraction grating 12 on the second surface 61*b* (the surface opposite to the first surface 61*a* on which the QCL element 13 and the MEMS diffraction grating 12 are disposed) of the support plate 61. The cooling element 7 is inserted into the concave portion 61*c*. With such a configuration, it is possible to shorten the interval between the QCL element 13 and the cooling element 7 compared to a case where the concave portion 61*c* is not provided in the support plate 61. Thus, the cooling effect of the cooling element 7 can be enhanced. In addition, the portion of the support plate 61 where the concave portion 61*c* is not provided can be thick enough to maintain the strength of the support plate 61. As a result, the physical stability of the support plate 61 can be improved compared with a case where the support plate 61 is uniformly thinned. As a result, it is possible to suppress deterioration of optical characteristics (for example, light emission characteristics of a laser) of the laser module 2.

Further, when viewed from the thickness direction D, at least a portion of the inner surface of the concave portion 61*c* of the support plate 61 may be in contact with at least a portion of the outer edge of the cooling element 7. According to the above configuration, since the cooling element 7 can be positioned by the concave portion 61*c,* it is possible to prevent the occurrence of variation in the arrangement of the cooling element 7 between products. In the present embodiment, as an example, the dimension of the first substrate 71 of the cooling element 7 coincides with the dimension of the concave portion 61*c*. That is, the first substrate 71 is formed to have a size that fits within the concave portion 61*c*. In this case, the entire of the inner surface of the concave portion 61*c* and the entire of the outer edge of the cooling element 7 (first substrate 71) can be brought into contact with each other. That is, by fitting the cooling element 7 (first substrate 71) into the concave portion 61*c,* the cooling element 7 can be more stable with respect to the support plate 61.

In addition, since the cooling element 7 is provided so as to overlap with both of the QCL element 13 and the MEMS diffraction grating 12, even if the cooling element 7 is thermally deformed, the thermal deformation is transmitted to both of the cooling element 7 and the MEMS diffraction grating 12 in the same manner. To be more specific, the influence of the thermal deformation of the cooling element 7 is similarly transmitted to the heat sink 8 on which the QCL element 13 is mounted and the wall portion 62 on which the MEMS diffraction grating 12 is mounted. Accordingly, it is possible to suppress the occurrence of a deviation in the relative positional relationship between the QCL element 13 and the MEMS diffraction grating 12 due to the thermal deformation of the cooling element 7.

In addition, the MEMS diffraction grating 12 may include the diffraction reflection portion 28 that diffracts and reflects a portion of the light emitted from the QCL element 13, and may return the portion of the light to the QCL element 13 by oscillating the diffraction reflection portion 28. That is, the MEMS diffraction grating 12 has a configuration in which a diffraction grating (diffraction reflection portion 28) and a movable mechanism (movable portion 23) are integrally provided. Thus, in the Littrow type laser module 2, the cooling effect can be enhanced while suppressing deterioration of the optical characteristics.

A circuit board (for example, a circuit board corresponding to the first circuit board 31 described above) for controlling the operation of the QCL element 13 may not be disposed on a side (that is, a side of the cooling element 7 near the bottom wall 51) of the cooling element 7 opposite to a side of the cooling element 7 facing the support plate 61. In this case, since the circuit board as the heat generation source is not provided on the side opposite to the support plate 61 in the cooling element 7, it is possible to prevent the exhaust heat of the cooling element 7 from being hindered. Thus, the cooling effect of the cooling element 7 can be further enhanced. More specifically, as described above, the first circuit board 31 on which the pulse driver circuit is mounted generates a relatively large amount of heat. By arranging the first circuit board 31 and the support plate 61 so as to be thermally separated from each other, it is possible to suppress a thermal influence on the light emission characteristics of the laser.

The auxiliary cooling element 33 that further cools the cooling element 7 may be disposed on the side (that is, the side of the cooling element 7 near the bottom wall 51) of the cooling element 7 opposite to the side of the cooling element 7 facing the support plate 61. In this case, the cooling effect can be further enhanced by the auxiliary cooling element 33. Note that such a configuration can be realized by arranging a circuit board (for example, a circuit board corresponding to the first circuit board 31 described above), which is conventionally arranged generally below the cooling element 7, in the housing 5.

In addition, the laser module 2 may include a plurality of struts (in the present embodiment, each of the struts B1, B2) erected on the first surface 61*a* of the support plate 61 and extending along the thickness direction D, and a strut connecting member (in the present embodiment, each of the first circuit board 31 and the second circuit board 32) disposed at a position farther from the support plate 61 than the QCL element 13 in the thickness direction D and connected to each end of the plurality of struts B1, B2. According to the above-described configuration, since the support plate 61 is appropriately supported by the plurality of struts and strut connecting member, the physical stability of the support plate 61 can be further improved. As a result, it is possible to more effectively suppress the deterioration of the optical characteristics of the laser module 2.

The laser module 2 may include a plurality (four in the present embodiment) of struts B1 and a first circuit board 31 connected to an end portion of each of the plurality of struts B1. The first circuit board 31 may be a circuit board for controlling the operation of the QCL element 13. In the present embodiment, as an example, the first circuit board 31 is a circuit board on which a pulse driver circuit is mounted. If the first circuit board 31 is in contact with the cooling element 7, heat generated from the first circuit board 31 may be transmitted to the QCL element 13 via the cooling element 7 and the support plate 61. Alternatively, heat generated from the first circuit board 31 may inhibit exhaust heat of the cooling element 7. On the other hand, according to the configuration in which the first circuit board 31 is supported via the plurality of struts B1 as described above, the first circuit board 31 serving as a heat generation source is disposed at a position away from the cooling element 7, and thus it is possible to avoid the above-described problem. Further, as described above, it is possible to obtain an effect of enhancing the physical stability of the support plate 61. That is, the first circuit board 31 can function as the strut connecting member described above. By incorporating the pulse driver circuit into the housing 5, the entire of the laser light source (laser module 2) can be reduced in size.

Also, the laser module 2 may include a noise filter circuit 32A. The noise filter circuit receives a power signal from an external power supply, removes noise included in the power signal, and outputs the power signal from which the noise is removed to the first circuit board 31. In the present embodiment, the noise filter circuit is mounted on the second circuit board 32. According to the above configuration, since the noise superimposed on the power signal is removed by the noise filter circuit, it is possible to prevent damage to the first circuit board 31 caused by an electrostatic surge or the like. In addition, when the power signal is supplied to the QCL element 13 and the MEMS diffraction grating 12 through the first circuit board 31, damage to the QCL element 13 and the MEMS diffraction grating 12 may be prevented.

In addition, the laser module 2 may include a plurality (two in the present embodiment) of struts B2 and a second circuit board 32 disposed at a position between the QCL element 13 and the first circuit board 31 in the thickness direction D and connected to an end portion of each of the plurality of struts B2. Here, the first circuit board 31 has a higher heat generation property than the second circuit board 32. According to the above-described configuration, since heat generated from the first circuit board 31 is shielded by the second circuit board 32, heat transfer from the first circuit board 31 to the QCL element 13 can be suppressed.

When viewed from the thickness direction D, the second circuit board 32 may overlap with at least a portion of the QCL element 13 (in the present embodiment, as an example, the entire of the QCL element 13) and at least a portion of the first circuit board 31. According to the above configuration, it is possible to more effectively suppress heat transfer from the first circuit board 31 to the QCL element 13.

The second circuit board 32 may be a circuit board on which the above-described noise filter circuit 32A is mounted. According to the above configuration, the substrate on which the noise filter circuit 32A is mounted can function as the second circuit board 32 that shields heat generated from the first circuit board 31. Accordingly, compared to a configuration in which a member for shielding heat from the first circuit board 31 and a substrate on which the noise filter circuit 32A is mounted are separately provided, the size of the module (housing 5) can be reduced. In addition, in the present embodiment, the size of the module depends on the size of the first circuit board 31 (the diameter of the disk-shaped substrate). As in the above embodiment, by separating the pulse driver circuit (first circuit board 31) and the noise filter circuit 32A (second circuit board 32) from each other, it is possible to reduce the size of the first circuit board 31 and thus to reduce the size of the module. To be more specific, if the size of the first circuit board 31 can be reduced, the size of the support plate 61 that supports the first circuit board 31 can also be reduced accordingly. As a result, the width and depth of the housing 5 (i.e., the vertical and horizontal dimensions when the housing 5 is viewed from the thickness direction D as shown in FIG. 2) can be reduced.

In addition, the laser module 2 may include the heat transfer sheet 34 disposed between the support plate 61 and the cooling element 7 in the concave portion 61*c* of the support plate 61. According to the above configuration, since the heat transfer performance between the support plate 61 and the cooling element 7 can be improved, the cooling effect can be further enhanced.

In addition, the concave portion 51*b* into which at least a portion of the cooling element 7 on a side facing the bottom wall 51 (that is, at least a portion of the second substrate 72 near the bottom wall 51) is inserted may be provided on a surface of the bottom wall 51 facing the cooling element 7. According to the above configuration, the cooling element 7 can be easily arranged with respect to the bottom wall 51 by the concave portion 51*b*. In the present embodiment, as an example, the dimension of the second substrate 72 of the cooling element 7 coincides with the dimension of the concave portion 51*b*. In other words, the second substrate 72 is formed to have a size that fits within the concave portion 51*b*. In this case, the entire of the inner surface of the concave portion 51*b* and the entire of the outer edge of the cooling element 7 (second substrate 72) can be brought into contact with each other. That is, by fitting the cooling element 7 (second substrate 72) into the concave portion 51*b,* the cooling element 7 can be further stabilized with respect to the bottom wall 51.

[Modification]

Although one embodiment of the present disclosure has been described above, the present disclosure is not limited to the above embodiment. The material and shape of each component are not limited to those described above, and various materials and shapes may be employed. For example, in the above-described embodiment, the external resonator may be configured in a Littman type. In this case, the laser module 2 may include, for example, a fixed (non-movable) diffraction grating and a movable mirror for reflecting first order diffracted light of the diffraction grating instead of the MEMS diffraction grating 12 integrally configured with the movable portion 23 described above.

In addition, the first circuit board 31 may not necessarily be disposed in the housing 5. The same applies to the second circuit board 32. In such a case, the laser module 2 may include a strut connecting member (for example, a plate-shaped member extending parallel to the support plate 61) other than the first circuit board 31 and the second circuit board 32 and a strut that connects the strut connecting member and the support plate 61 in order to improve the physical stability of the support plate 61.

In the above-described embodiment, the bottom wall 51 of the housing 5 functions as a support plate for attaching the base plate 61. However, the support plate 61 may be attached to a base plate different from the bottom wall 51 (for example, a substrate disposed on the bottom wall 51 in the housing 5). In this case, the auxiliary cooling element 33 may be disposed between the base plate and the bottom wall 51.

Further, in a case where a sufficient cooling effect is exhibited only by the cooling element 7, the auxiliary cooling element 33 may be omitted. Similarly, the heat transfer sheet 34 may be omitted.

In addition, in the above-described embodiment, when viewed from the thickness direction D, the concave portion 61*c* of the support plate 61 is formed so as to overlap with the entire of the submount 16 on which the QCL element 13 is mounted and the entire of the wall portion 62 on which the MEMS diffraction grating 12 is mounted. However, the range and size of the region in which the concave portion 61*c* is formed are not limited to the above-described embodiment. The concave portion 61*c* may overlap with at least a portion of the QCL element 13. Preferably, the concave portion 61*c* is formed so as to overlap with the entire of the QCL element 13. For example, the concave portion 61*c* may be formed to overlap with the entire of the QCL element 13 and a portion of the submount 16. More preferably, the concave portion 61*c* is formed to overlap with the entire of the submount 16. When the lens 9B protrudes from the submount 16 when viewed from the thickness direction D, the concave portion 61*c* is preferably formed so as to overlap with the entire of the submount 16 and the lens 9B. The concave portion 61*c* may at least overlap with the diffraction reflection portion 28 in which the diffraction grating is formed in the MEMS diffraction grating 12. Preferably, the concave portion 61*c* is formed to overlap with the entire of the wall portion 62 as in the present embodiment.

The range and size of the cooling element 7 may be the same as the range and size of the concave portion 61*c* described above. That is, the cooling element 7 may overlap with at least a portion of the QCL element 13. Preferably, the cooling element 7 is formed so as to overlap with the entire of the QCL element 13. For example, the cooling element 7 may be formed to overlap with the entire of the QCL element 13 and a portion of the submount 16. More preferably, the cooling element 7 is formed to overlap with the entire of the submount 16. When the lens 9B protrudes from the submount 16 when viewed from the thickness direction D, the cooling element 7 is preferably formed so as to overlap with the entire of the submount 16 and the lens 9B. Further, the cooling element 7 may overlap with at least the diffraction reflection portion 28 in which the diffraction grating is formed in the MEMS diffraction grating 12. Preferably, the cooling element 7 is formed to overlap with the entire of the wall portion 62 as in the present embodiment.

In the above-described embodiment, the area of portion of the support plate 61 where the concave portion 61*c* is not formed (thick portion other than the concave portion 61*c* viewed from the thickness direction D) is larger than the area of the concave portion 61*c* (i.e., thin portion). Thus, the physical stabilization of the support plate 61 can be suitably secured. However, the area of the thick portion (portion other than the concave portion 61*c*) may be smaller than the area of the thin portion (concave portion 61*c*).

REFERENCE SIGNS LIST

1: analyzing device, 2: external cavity laser module, 3: photodetector, 7: cooling element, 11: quantum cascade laser, 12: MEMS diffraction grating (diffraction grating), 13: quantum cascade laser element, 28: diffraction reflection portion, 31: first circuit board (strut connecting member), 32: second circuit board (strut connecting member), 33: auxiliary cooling element, 34: heat transfer sheet, 51: bottom wall (base plate), 51*b:* concave portion, 61: support plate, 61*a:* first surface, 61*b:* second surface, 61*c:* concave portion, B1, B2: strut, D: thickness direction.

The invention claimed is:

1. An external cavity laser module comprising:

a quantum cascade laser element;

a diffraction grating configured to diffract and reflect a portion of light emitted from the quantum cascade laser element and return the diffracted and reflected light to the quantum cascade laser element;

a support plate having a first surface on which the quantum cascade laser element and the diffraction grating are disposed and a second surface opposite to the first surface; and a cooling element disposed on a side facing the second surface of the support plate so as to overlap with the quantum cascade laser element and the diffraction grating when viewed from a thickness direction of the support plate, wherein the cooling element includes a first substrate disposed on a side facing the support plate, a second substrate disposed on a side of the first substrate opposite to the side facing the support plate, and a heat transfer portion disposed between the first substrate and the second substrate, a concave portion that is recessed in a direction from the second surface toward the first surface is provided in at least a region of the second surface of the support plate that overlaps with the quantum cascade laser element and the diffraction grating when viewed from the thickness direction of the support plate, at least a portion of the first substrate facing the support plate is inserted into the concave portion, a ratio of a depth of the concave portion to a thickness of the support plate is in a range of 10% to 50%, and the depth of the concave portion is smaller than a thickness of the first substrate.

2. The external cavity laser module according to claim 1, wherein when viewed from the thickness direction of the support plate, at least a portion of an inner surface of the concave portion is in contact with at least a portion of an outer edge of the cooling element.

3. The external cavity laser module according to claim 1, wherein the diffraction grating includes a diffraction reflection portion configured to diffract and reflect a portion of the light emitted from the quantum cascade laser element, and returns the portion of the light to the quantum cascade laser element by oscillating the diffraction reflection portion.

4. The external cavity laser module according to claim 1, wherein a circuit board for controlling operation of the quantum cascade laser element is not disposed on a side of the cooling element opposite to a side of the cooling element facing the support plate.

5. The external cavity laser module according to claim 4, wherein an auxiliary cooling element that further cools the cooling element is disposed on the side of the cooling element opposite to the side of the cooling element facing the support plate.

6. The external cavity laser module according to claim 1, further comprising:

a plurality of struts erected on the first surface of the support plate and extending along the thickness direction of the support plate; and a strut connecting member disposed at a position farther from the support plate than the quantum cascade laser element in the thickness direction of the support plate and connected to an end portion of each of the plurality of struts.

7. The external cavity laser module according to claim 1, further comprising:

a plurality of first struts erected on the first surface of the support plate and extending along the thickness direction of the support plate; and a first circuit board disposed at a position farther from the support plate than the quantum cascade laser element in the thickness direction of the support plate and connected to an end portion of each of the plurality of first struts, wherein the first circuit board is a circuit board for controlling an operation of the quantum cascade laser element.

8. The external cavity laser module according to claim 7, further comprising a noise filter circuit that receives a power signal from an external power source, removes noise included in the power signal, and outputs a noise-removed power signal to the first circuit board.

9. The external cavity laser module according to claim 7, further comprising:

a plurality of second struts erected on the first surface of the support plate and extending along the thickness direction of the support plate; and a second circuit board disposed at a position between the quantum cascade laser element and the first circuit board in the thickness direction of the support plate and connected to an end portion of each of the plurality of second struts, wherein the second circuit board generates a smaller amount of heat than the first circuit board.

10. The external cavity laser module according to claim 9, wherein the second circuit board overlaps with at least a portion of the quantum cascade laser element and at least a portion of the first circuit board when viewed from the thickness direction of the support plate.

11. The external cavity laser module according to claim 9, wherein the second circuit board is a circuit board that includes a noise filter circuit, and the noise filter circuit is configured to receive a power signal from an external power source, remove noise included in the power signal, and output a noise-removed power signal to the first circuit board.

12. The external cavity laser module according to claim 1, further comprising a heat transfer sheet disposed between the support plate and the cooling element in the concave portion of the support plate.

13. The external cavity laser module according to claim 1, further comprising a base plate disposed on a side of the cooling element opposite to a side of the cooling element facing the support plate, wherein a concave portion into which at least a portion of the second substrate on a side facing the base plate is inserted is provided on a surface of the base plate facing the cooling element.

14. The external cavity laser module according to claim 1, wherein the depth of the concave portion is greater than half the thickness of the first substrate.

15. The external cavity laser module according to claim 1, further comprising a base plate, wherein the support plate is fixed to the base plate by a plurality of screws in a portion outside the concave portion, and the plurality of screws are arranged at positions facing each other across the concave portion when viewed from the thickness direction of the support plate.

16. The external cavity laser module according to claim 13, wherein a depth of the concave portion of the base plate is smaller than a thickness of the second substrate.

17. The external cavity laser module according to claim 1, wherein an area of a portion of the support plate where the concave portion is not formed is larger than an area of the concave portion.

* * * * *